United States Patent [19]

Scherer et al.

[11] Patent Number: 4,649,229

[45] Date of Patent: Mar. 10, 1987

[54] ALL METAL FLAT PACKAGE FOR MICROCIRCUITRY

[75] Inventors: Jeremy D. Scherer; Steven A. Tower, both of Dartmouth, Mass.

[73] Assignee: Aegis, Inc., New Bedford, Mass.

[21] Appl. No.: 764,567

[22] Filed: Aug. 12, 1985

[51] Int. Cl.⁴ .............................................. H05K 5/04
[52] U.S. Cl. .................................. 174/52 FP; 29/588; 357/74
[58] Field of Search ............ 174/52 FP, 52 H, 16 HS; 357/74, 81; 29/588

[56] References Cited

U.S. PATENT DOCUMENTS

| | | | |
|---|---|---|---|
| 3,219,748 | 11/1965 | Miller | 174/52 H |
| 3,514,849 | 6/1970 | Landron, Jr. | 29/588 |
| 3,602,634 | 8/1971 | Meuli | 29/588 X |
| 4,266,090 | 5/1981 | Scherer | 174/52 FP |

Primary Examiner—Arthur T. Grimley
Assistant Examiner—D. A. Tone
Attorney, Agent, or Firm—Fidelman, Wolffe & Waldron

[57] ABSTRACT

A flat package for electric microcircuits has an iron-nickel-cobalt alloy frame which is brazed to a molybdenum bottom at a temperature below about 400° C. The molybdenum bottom has successive layers of copper, nickel and gold plating.

7 Claims, 1 Drawing Figure

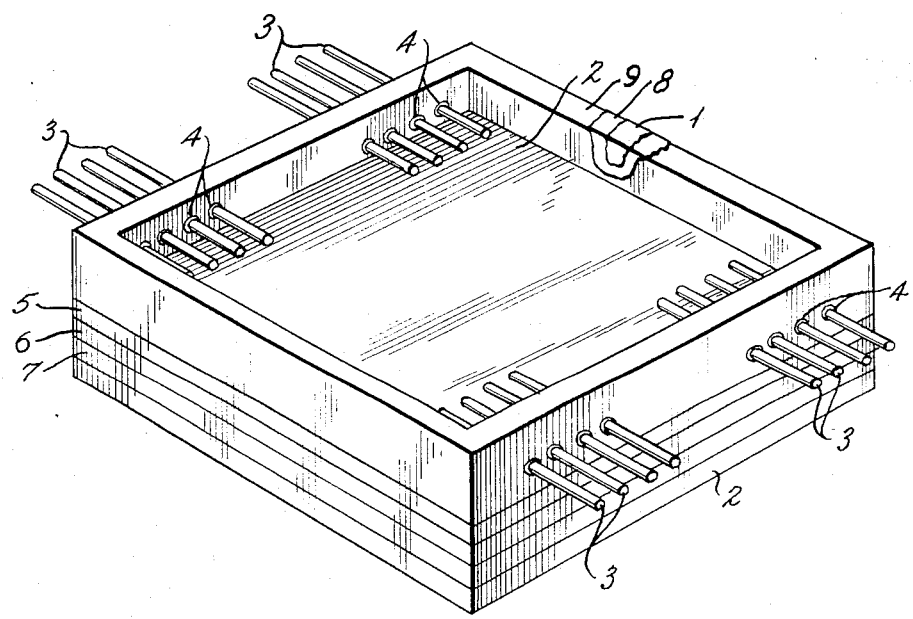

ALL METAL FLAT PACKAGE FOR MICROCIRCUITRY

This invention relates to electrical circuit packages. More particularly, this invention relates to all-metal flat packages for microcircuitry.

BACKGROUND OF THE INVENTION

All-metal flat packages now in use normally include three major metal components, the first of which is a frame, generally a continuous ring of metal that extends around the periphery of the package and forms the side walls of the package. Electrical leads which extend through the frame constitute the second component of the flat package. Generally, the electrical leads pass through two opposing sides of the package and are normally glass-sealed within openings in the frame.

The third component of the package is the bottom upon which the microcircuit substrate is affixed. In addition to the three components discussed, the assembly includes a lid which is attached following installation of the microcircuit within the package.

Presently, all-metal microcircuitry packages which are flat packages are constructed of Kovar TM, with the Kovar TM frame and bottom often being joined together by means of a high temperature copper braze.

Kovar TM is an iron-nickel-cobalt alloy, developed by Westinghouse Corporation, containing 53% iron, 29% nickel, 17% cobalt with 1% minor ingredients or impurities. Kovar TM finds widespread use in microcircuitry packaging and Kovar TM flat packages comprise a great majority of the all-metal flat packages produced throughout the world.

The advantages gained by the utilization of Kovar TM in producing all-metal flat packages include ready acceptance of glass sealing of leads extending therethrough and a coefficient of expansion which closely approximates that of 96% alumina, the material most widely employed as microcircuit substrates which are to be housed in the packages. The compatible coefficient of expansion of Kovar TM to that of alumina permits the alumina substrate, hence the microcircuit, to be integrally bonded to the package, as by known soldering techniques, particularly advantageous as the soldering of the substrate into a package provides generally higher conductivity than if the substrate were to be attached to the bottom of the package by means of, e.g., epoxy glue or the like. Additionally, the bonding of the substrate to the bottom of the package by soldering generally provides greater mechanical strength to the assembly, as well.

While Kovar TM exhibits desirable glass-sealing and thermal expansion properties, this alloy possesses a very low coefficient of thermal conductivity, in the order of about 0.04 cal/cm$^2$/CM/sec/°C., which property presents a problem of less than desirable heat dissipation from power chips through the bottom of the flat package to a heat sink. Solutions to this problem have included reduction of the thermal impedence of Kovar TM flat packages by reducing drastically the thickness of the bottom, thereby reducing the length of the heat path from the substrate of the microcircuit chip to the heat sink. Such technique, while serving to reduce the thermal impedence somewhat, tends to materially reduce the strength of the package bottom, with the probability of problems usually manifested in shock and vibration tests and the possibility of cracking the substrate existent. Additionally, if the bottom is flexible and the substrate is rigid, the substrate may peel from the bottom, due to the bottom becoming curved while the substrate remains flat, thus concentrating the separation force around the edges instead of maintaining equal separation of the separation forces. Generally, a thickness of about 0.010″ for small packages such as 0.5 in$^2$ and thicknesses on the order of 0.015 to about 0.20″ for packages of 1 in$^2$ are acceptable.

U.S. Pat. No. 4,266,090 provides for flat packages for microcircuits, the packages utilizing Kovar TM frames and characterized by high heat transfer properties. Such high heat transfer values are realized by brazing the Kovar TM frame at a temperature below about 500° C. to a molybdenum bottom having a plating sintered thereon at least in the areas of contact between the molybdenum bottom and the Kovar TM frame. Suitable plating metals include nickel, gold or similar metals which can be easily sintered into the areas of the molybdenum bodies plated. For example, in the case of nickel as the plating metal, sintering can be accomplished at temperatures on the order of about 350°–400° C. under an inert atmosphere or a vacuum. Generally, however, utilizing an inert atmosphere, for this particular application, it has been found that sintering must be conducted at much higher temperatures, on the order of 1000°–1100° C., to produce the required adherancy. Of course, the temperature employed depends also upon the rate of sintering desired.

Both the plating and sintering may be accomplished employing methods known to the metal plating and sintering arts.

While the technique described hereinabove has been utilized to produce a flat package for microcircuits, characterized by good heat transfer values, certain disadvantages result when this process is employed in producing all-metal flat packages. Initially, the sintering is an additional step which adds to the cost of producing the packages. Secondly, the temperatures necessary to produce the required adherancy are high enough to embrittle the molybdenum, decreasing the impact resistance thereof.

It is an object of the present invention to provide a flat package for microcircuits that is characterized by excellent heat transfer properties.

It is a further object of the present invention to provide a flat package for microcircuits, having a Kovar TM frame and excellent heat transfer properties, which package permits microcircuitry alumina substrates to be soldered to the base thereof.

It is yet another object of the present invention to provide a process for producing a flat package for microcircuits which eliminates the requirement for sintering metals plated to the molybdenum bottoms of all-metal flat packages.

These and other objects of the invention are achieved according to the present invention wherein an all-metal flat package having a Kovar TM frame and a molybdenum base is produced, the molybdenum bottom subjected to successive copper, nickel, and gold plating procedures prior to assemblage with the Kovar TM frame. Following the plating of the molybdenum, the coated molybdenum is joined to the Kovar TM frame, the necessary electrical leads having been glass-sealed therein, by brazing at a temperature below about 425° C.

In order to provide a hermetic package, the brazing forms a continuous seal between the frame and the bottom.

The ability of a flat package to dissipate heat requires a truly flat bottom for a good connection to an external heat sink. As previously stated, heating the molybdenum during sintering and/or brazing wherein temperatures on the order of about 1000° to 1100° C. are required, as with the process of U.S. Pat. No. 4,266,090, may create sufficient stresses in the bottom when the unit undergoes a cooling cycle as to produce undesirable irregularities therein, affecting the temper of the bottom with resultant embrittlement, and producing stresses which alter the flatness of the bottom.

Utilizing the process of the present invention, employing plating processes known to the art and brazing techniques similarly known to the art, assemblage of the unit can be effected at temperatures below about 425° C., well below the temperatures at which distortion of the molybdenum bottom can occur.

As has been stated, any suitable method known to the art may be employed to successively plate the molybdenum with copper, nickel and gold, processes involving either electroless or electrolytic deposition techniques being equally efficaceous.

Plating of the molybdenum is conducted in such fashion as to provide a triple-plated molybdenum bottom, plated at least in the area of the molybdenum which comes into contact with the frame itself. Preferably, the layers of plated metal are produced across the entire inner surface of the package.

The copper is plated to a thickness of from about 25 to about 200μ, preferably from about 50 to about 150μ; nickel to a thickness of from about 25 to about 200μ preferably from about 50 to about 150μ; and the gold layer to a thickness of from about 25 to about 200μ, preferably from about 50 to about 150μ.

Suitable brazes which can be employed to unite the plated molybdenum bottom to the Kovar TM frame include gold/tin, gold/ germanium, lead/silver and the like.

Preferably, gold/germanium is employed in the brazing step.

In assembling the all-metal flat package of the present invention, the necessary electrical leads are glass-sealed in the Kovar TM frame prior to brazing the frame to the metal-plated molybdenum bottom, permitting effective assembly of the leads, frame and bottom without subjecting the assembled frame and bottom to temperatures above about 425° C.

Any suitable method for glass-sealing of electrical leads in Kovar TM known to the art may be used in the assembling of the unit. In the processes used in and well-known to the art, the hermetic sealing of hybrid microcircuit packages is a multi-step process involving four major steps:
  (a) Cleaning and degreasing
  (b) Decarburizing
  (c) Pre-oxidizing; and
  (d) Glass sealing Generally, cleaning and degreasing procedures will vary depending on the size, shape and weight of the component part and basically the procedure consists of vapor degreasing in trichlor, anodic cleaning in an alkaline bath, HCl treatment for a short period at elevated temperatures, water rinsing, methanol bathing and drying.

The decarburizing and outgassing step generally consists of heating the part to an elevated temperature for 15 to 20 minutes in a wet reducing atmosphere.

Pre-oxidation is generally performed in an atmosphere containing from about 0.5 to about 20 percent $O_2$ at a temperature of from about 750° to about 900° C. for about 15 minutes, the time involved depending upon the size and weight of the part. Following pre-oxidation, the materials are stored in clean, dry containers until ready for use.

In effecting the glass-to-metal sealing, the assembled packages are subjected to heating at temperatures on the order of about 950° to 1050° C. under controlled, protective atmospheres for a time sufficient to achieve a uniform, hermetic bond at the glass to metal interface.

Following the assembling of the plated molybdenum bottom and the Kovar TM frame, the alumina substrate carrying electrical components and provided with terminal areas to which the electrical leads passing through the Kovar TM frame are attached, is installed. The attachment of the alumina substrate to the plated molybdenum bottom, and the attachment of the electrical leads to the terminals may be accomplished employing standard solders including, but not limited to, tin/lead, gold/tin, gold/germanium and the like.

Following mounting of the microcircuit in the flat package, a top is affixed to the package to provide a hermetic seal. Such lid is preferably also made of Kovar TM and may be permanently attached by means of welding, soldering or by adhesive materials.

This invention may be better understood with reference to the attached drawing depicting a perspective view of the flat package.

The flat package depicted in the drawing consists of Kovar TM frame 1 with molybdenum bottom 2, electrical leads 3, glass seals 4 and gold, nickel and copper layers 5, 6 and 7, respectively. In some instances Frame 1 may be plated with successive nickel and gold layers 8 and 9. It is to be understood that the thicknesses of layers 5, 6, 7, 8 and 9 are greatly exaggerated in the drawing.

The packages of the present invention are particularly useful when employed as housings for heat generating microcircuits, typical of which are power chips such as voltage regulators, voltage dividers and the like.

The size and configuration of a flat package will, of course, depend upon the specific application, and may be shaped according to need. The leads, the number of which will also vary depending upon the specific application, may be sealed in one or more sides of the flat package.

In a typical 1 inch by 1 inch package, the frame may be 0.130 inches high and 0.04 inches thick, the molybdenum bottom 0.040–0.060 inches thick, the copper layer 100μ thick, the nickel layer 100μ thick and the gold layer 75μ thick.

Modification of this invention being readily apparent to those of ordinary skill in the art, it is intended that the scope of this invention be limited only to the appended claims.

We claim:
1. A flat package for electric microcircuits comprising:
  (a) a frame consisting of an iron-nickel-cobalt alloy having electrical leads extending therethrough, said leads being glass-sealed therein;
  (b) a molybdenum bottom, said molybdenum bottom having successive copper, nickel and gold plated layers thereon, said plated layers at least in the area of contact with said frame;

(c) said frame forming the side walls of the package and being brazed to said molybdenum bottom to form a continuous seal between said frame and said bottom; and (d) said brazing having been accomplished after said leads are glass-sealed in said frame and said brazing effected at a temperature below about 400° C.

2. The package of claim 1 containing a microcircuit on a 96% alumina substrate which is soldered to said bottom.

3. The package of claim 2 wherein said microcircuit comprises a power chip.

4. A microcircuit package as defined by claim 1 containing a lid which is welded to said frame.

5. A flat package as defined by claim 1 wherein said frame is plated with successive nickel and gold layers.

6. A method of producing a flat package for electric microcircuit comprising:

(a) glass-sealing electrical leads in apertures in a frame consisting of an iron-nickel-cobalt alloy;

(b) brazing said frame at a temperature of less than about 400° C. to a molybdenum bottom having thereon successive non-sintered plated layers of copper, nickel and gold, said plating layers present in at least the area in contact with said frame.

7. The method of claim 6 wherein the frame is plated with successive layers of nickel and gold.

* * * * *